United States Patent [19]

Ward

[11] 3,801,882

[45] Apr. 2, 1974

[54] THERMO-ELECTRIC MOUNTING METHOD FOR RF SILICON POWER TRANSISTORS

[75] Inventor: John L. Ward, Hyattsville, Md.

[73] Assignee: The United States of America as represented by the Secretary of the Navy, Washington, D.C.

[22] Filed: Jan. 11, 1973

[21] Appl. No.: 322,807

[52] U.S. Cl. ...... 317/234 R, 317/234 A, 317/234 G, 174/15, 333/84 M

[51] Int. Cl. ...... H01l 3/00, H01l 5/00

[58] Field of Search ...... 317/234, 1, 4, 4.1, 5.4, 317/101 C; 174/15; 333/84 M

[56] References Cited

UNITED STATES PATENTS

| | | | |
|---|---|---|---|
| 3,025,437 | 3/1962 | Van Namen et al. | 317/234 G |
| 3,155,881 | 11/1964 | Jean | 317/234 G |
| 3,211,922 | 10/1965 | Gregory et al. | 317/234 A |
| 3,249,680 | 5/1966 | Sheets et al. | 317/234 A |
| 3,261,396 | 7/1966 | Trunk | 317/234 A |
| 3,261,904 | 7/1966 | Wulc | 317/234 A |
| 3,391,242 | 7/1968 | Sudges | 317/234 A |
| 3,673,470 | 6/1972 | Louvel | 317/234 P |

*Primary Examiner*—Andrew J. James
*Attorney, Agent, or Firm*—R. S. Sciascia; Arthur L. Branning

[57] ABSTRACT

A thermo-electric transistor mounting fixture is provided, using a mounting fixture/heat sink, a beryllium oxide washer, brass spacer, emitter ground pin socket and nylon hold down screws. The mounting fixture provides a design in which the transistor is held in physical contact and alignment with the spacer and insulating washers. Thermal conduction and transfer of heat is accomplished through the application of thermal joint compound between the interfacing surfaces of the washers. The important electrical feature is the elimination of emitter lead length problems by grounding the emitter in the chassis/Faraday shield with the shortest possible lead length with an integral grounding pin. The brass spacer is slotted to allow exiting of the collector lead and facilitating its connection to the collector circuit. The beryllium washer provides required electrical and RF insulation from ground. The combination of the above features provide an effective and efficient high frequency transistor mounting fixture.

2 Claims, 5 Drawing Figures

THERMO-ELECTRIC MOUNTING METHOD FOR RF SILICON POWER TRANSISTORS

BACKGROUND OF THE INVENTION

The invention relates generally to the electrical and mechanical requirements of silicon power transistors as used in VHF and UHF transmitting circuits and more specifically to inductive lead length problems, RF shielding and heat dissipation.

High frequency transistors operating at high and intermediate power levels have always been one of the more difficult engineering problems. The transistor, with its unique characteristics, along with parasitic elements, presents limiting factors and design constraints on the circuit engineer. To provide design requirements and realize power gain expectations, low lead impedance, shielding, and the removal of heat, become important requirements.

Experience has shown that other methods of design in eliminating and reducing lead inductance problems, such as emitter tuning by series resonating of the emitter lead inductance, are less than satisfactory at higher frequencies. The most critical parasitics arise from the emitter lead inductance and the base lead inductance. Both the emitter and base lead inductances can cause variations in the input and output impedances resulting in frequency selectivity of the input and output networks that are sensitive to frequency and bandwidth. Input and output networks in common emitter circuits should perform with a minimum of tuning interaction and exhibit good stage gain, since very small amounts of inductive degeneration can drastically reduce circuit gain at higher frequencies. Stage gain is therefore very dependent on the value of impedance that is in series with the emitter.

The problem in mounting transistors for high frequency operation is one of providing that the emitter lead be an integrated structure with the ground plane. The integrated structure eliminates lead inductance problems and facilitates associated heat removal through the use of a proper heat sink. In placing a transistor in any circuit under the above conditions, the other design requirements such as dc supply, RF drive, and RF packaging must be considered and made compatible with the mounting device. The requirement then suggests that the emitter lead must be as short as possible and the power transistor be physically mounted to accomplish all specifications of the design. The silicon transistor in the typical TO-5 case design, with the separate emitter lead and the collector connected directly to the case must be mechanically integrated to the chassis or physically constructed to provide the above described RF and thermal optimization. The shortest possible lead provided to the transistor device with the conventional lead attachment at frequencies above 50 MHz in most cases is unsatisfactory since fabrication of the mechanical/electrical connection requires some physical length. Physical length is, in most cases, objectionable since fabrication of the emitter connection requires a length that is critical at high frequencies.

An integral part of the lead length problem is the requirement for shielding, that is, the isolation of input and output circuitry to reduce tuning interaction and feedthrough between the input and output circuits. As explained above, lead length inductance can, and does, affect circuit interaction; improper shielding will cause stage degradation in performance. Proper shielding is of great importance at high frequency and must be optimized.

Another important part of the mounting problem involves the removal of heat generated by the transistor. Intermediate and high frequency operation of silicon power transistors, results in the generation of heat, that if not efficiently removed, results in thermal resistance losses which become uncontrollable, and in the extreme case, failure of the device by action of heat buildup in excess of tolerable transistor junction temperature. An effective solution to the heat buildup is to provide an efficient thermal conduction path to draw heat from the transistor; allowing it to operate with efficient design parameters and safely at high power levels.

SUMMARY OF THE INVENTION

It is therefore the object of the invention to provide a transistor mounting device which allows efficient thermal conduction, minimizes lead inductance problems and provides proper shielding.

Other objects, advantages and novel features of the invention will become apparent from the following detailed description of the invention when considered in conjunction with the accompanying drawings wherein:

The invention overcomes the disadvantages of the prior art through the use of a mounting fixture comprising an anodized mounting flange, a brass spacer, a beryllium oxide washer, nylon screws and a Faraday mounting shield. The mounting fixture is designed to hold a transistor in a TO-5 case in physical contact with the shield mounting plate on one side and to a brass washer and beryllium oxide washer on the other side. The anodized layer of the shield mounting plate is electrically insulative as is the beryllium. However both are thermally conductive resulting in good heat flow to the surrounding metal surfaces. The design also eliminates lead induction problems by grounding the emitter lead to the chassis which acts as a Faraday shield. The shortest possible lead length is obtained by using an integral grounding pin. The nylon screws attach the mounting flange and provide the necessary pressure for thermal conduction.

DETAILED DESCRIPTION OF THE PREFERRED EMBODIMENT

Figure 1:
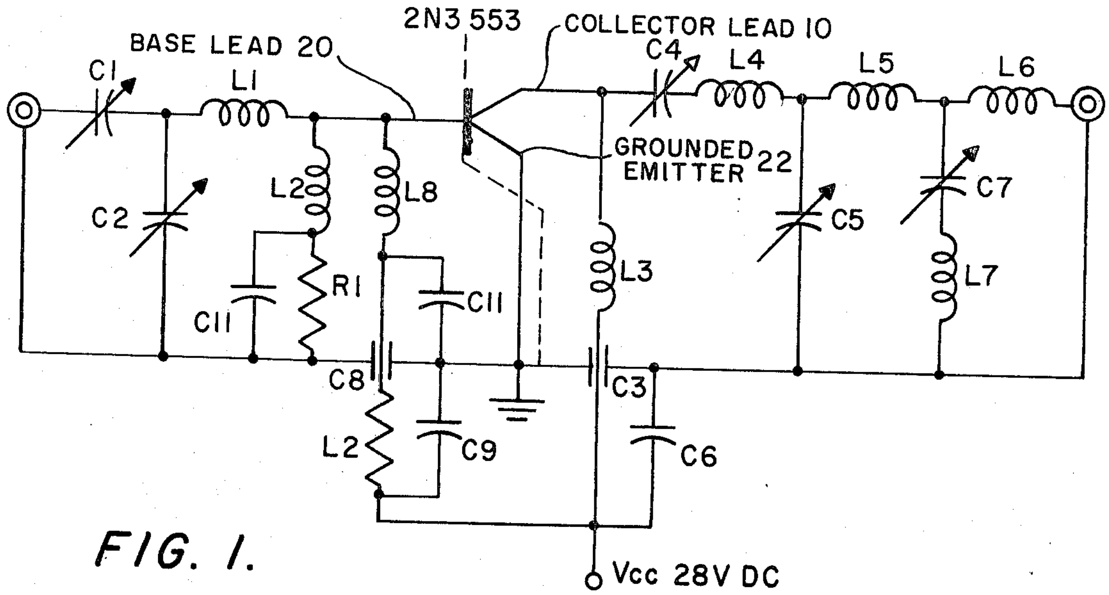
FIG. 1 is an illustration of a typical circuit in which the preferred embodiment would be applicable.

FIG. 1 shows a typical circuit for which the mounting device of the present invention could be used. The circuit shown in FIG. 1 is a 180 MHz amplifier using a ZN3553 RF transistor. Typically many of the high frequenty amplifiers have grounded emitter leads as shown in the circuit of FIG. 1. At these frequencies many transmission problems result including shielding problems and lead induction problems. The structure of FIGS. 2A, 2B, 2C and 3 solve these problems and in addition provide efficient thermal cooling of the transistor.

Figure 3:
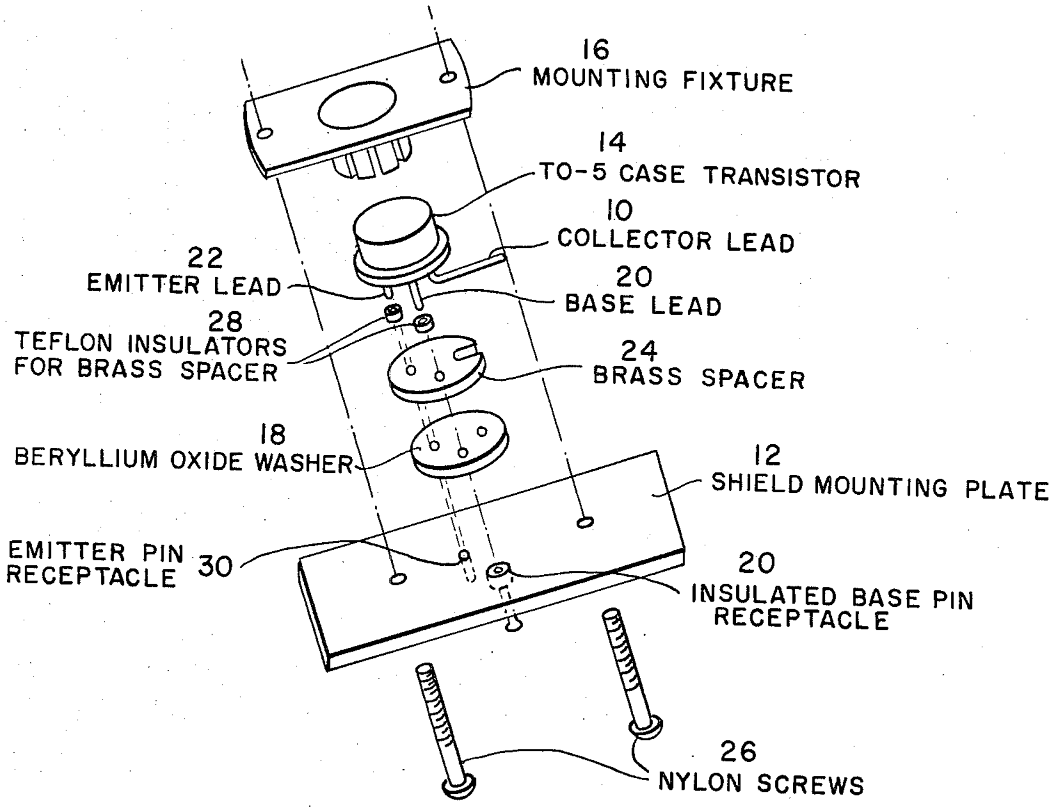
FIG. 3 is an assembly and parts illustration of the preferred embodiment.
Figure 2A:
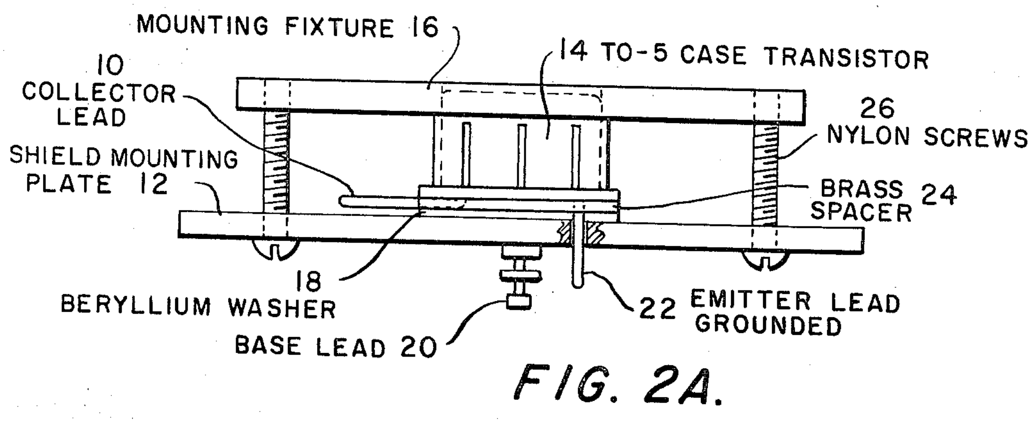
FIG. 2A is a side view of the preferred embodiment.
Figure 2B:
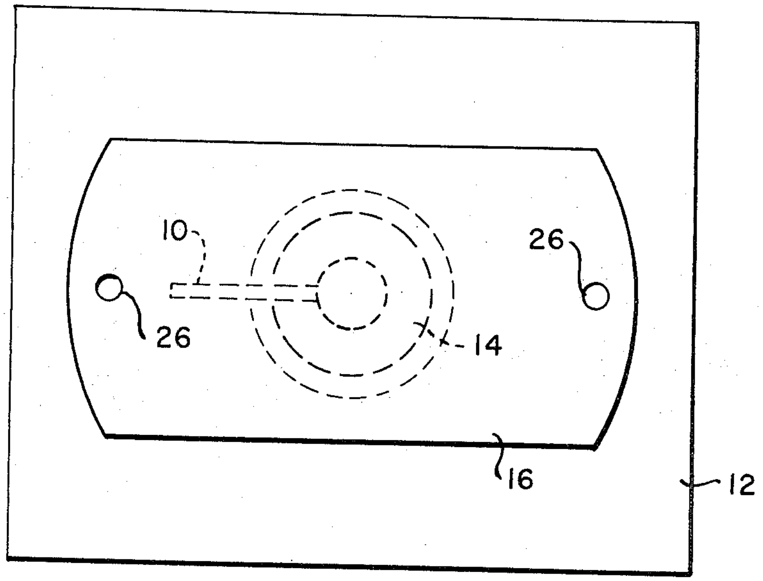
FIG. 2B is a plain view of the preferred embodiment.
Figure 2C:
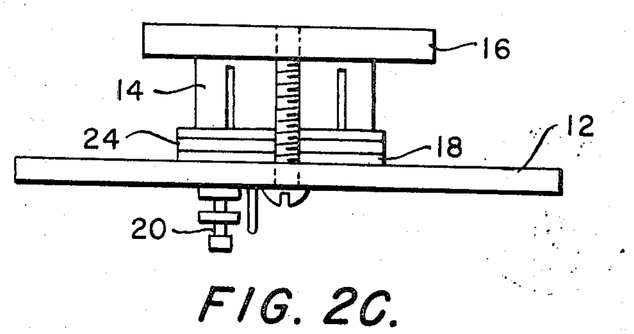
FIG. 2C is an end view of the preferred embodiment.

FIG. 2A is a side view of the mounting structure. Nylon screws 26 hold the mounting fixture 16 to the TO-5 case transistor 14 as also seen in the side view in FIG. 2C. The mounting fixture 16 is anodized to electrically insulate it from the transistor while still permitting heat conduction. Brass spacer 24 has a slot in it as seen in FIG. 3 thereby giving the collector lead 10 an exit from the mounting device. The top view of FIG. 2B clearly shows the position of the collector lead 10. Below the brass spacer 24 a beryllium oxide washer 18 is placed to electrically insulate the brass spacer 24 from the shield mounting plate 12. In addition, the beryllium oxide washer 18 permits heat conduction from the transistor to the shield mounting plate. Thus the transistor is afforded heat conduction to both the shield mounting plate 12 and the mounting fixture 16 while remaining electrically insulated from both. These elements also shield the transistor and its leads from interfering radiation.

FIG. 3 shows the various parts of the preferred embodiment and the manner in which they are assembled. Emitter pin recepticle 30 grounds the emitter lead to the shield mounting plate 12 so that the shortest possible length of emitter lead is necessary. This greatly reduces emitter lead induction problems. In addition an insulated base pin recepticle 20 is shown which permits the base lead of the transistor to protrude through the shield mounting plate and be electrically insulated from it. This arrangement also allows the shortest possible length of base lead which acts to cut down base lead induction problems.

Thus the structure of the mounting device affords radiation shielding, while permitting thermal conduction from the transistor and minimizing lead induction problems by shortening the transistor leads. The combination of the feature provides an effective and efficient high frequency transistor mounting fixture.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A structure for mounting a high frequency case type transistor comprising:

an electrically and heat conductive mounting plate;

a pin receptacle adapted to receive an emitter lead received within an aperture in said plate and electrically connected thereto;

a berylium oxide washer mounted on said plate and having an aperture therein in axial alignment with said plate aperture;

a metal mounting fixture having a hollow cylindrical portion adapted to receive a transistor case, and electrically insulating fasteners securing said mounting fixture to said plate.

2. The mounting structure of claim 1 wherein the surfaces of said mounting fixture are provided with an anodized layer to permit heat conductivity and provide electrical insulation with said transistor.

* * * * *